(12) United States Patent
Gattung et al.

(10) Patent No.: US 8,294,496 B2
(45) Date of Patent: Oct. 23, 2012

(54) SAWTOOTH OSCILLATOR

(75) Inventors: Michael Gattung, Hamburg (DE); Gerhard Osterloh, Schulp (DE); Ralf Beier, Hamburg (DE)

(73) Assignee: NXP B.V., Eindhoven (NL)

( * ) Notice: Subject to any disclaimer, the term of this patent is extended or adjusted under 35 U.S.C. 154(b) by 34 days.

(21) Appl. No.: 13/110,881

(22) Filed: May 18, 2011

(65) Prior Publication Data

US 2011/0285428 A1 Nov. 24, 2011

(30) Foreign Application Priority Data

May 21, 2010 (EP) .................................... 10163631

(51) Int. Cl.
*H03K 4/06* (2006.01)
(52) U.S. Cl. ............................................. 327/131
(58) Field of Classification Search ........... 327/131–140
See application file for complete search history.

(56) References Cited

U.S. PATENT DOCUMENTS

| | | | |
|---|---|---|---|
| 4,216,387 A | | 8/1980 | Reed |
| 4,292,942 A | * | 10/1981 | Katada et al. ............ 123/406.59 |
| 5,760,623 A | | 6/1998 | Hastings |
| 6,087,788 A | * | 7/2000 | Kawasumi ................ 315/364 |
| 6,930,520 B2 | * | 8/2005 | Solie ........................... 327/131 |
| 8,044,690 B2 | * | 10/2011 | Patel et al. ................ 327/131 |
| 2008/0265954 A1 | | 10/2008 | Devilbiss |
| 2010/0289548 A1 | * | 11/2010 | Cheng ........................ 327/176 |
| 2011/0050315 A1 | * | 3/2011 | Beier et al. ............... 327/307 |
| 2011/0089918 A1 | * | 4/2011 | Chang ........................ 323/282 |

OTHER PUBLICATIONS

Extended European Search Report for Patent Appln. No. 10163631.4 (Dec. 16, 2010).

* cited by examiner

*Primary Examiner* — Lincoln Donovan
*Assistant Examiner* — William Hernandez

(57) ABSTRACT

A sawtooth generator circuit comprises a first triangular waveform generator with equal ramp up and ramp down rates and a second triangular waveform generator with equal ramp up and ramp down rates and which are equal to the ramp up and ramp down rates of the first triangular waveform generator. The first and second triangular waveform generators are controlled to be 180 degrees out of phase. A switching arrangement alternately switches the increasing or decreasing ramps of the first and second triangular waveform generators to an output of the sawtooth generator circuit.

The invention provides a sawtooth generator circuit which is suitable for high frequency applications, with low current consumption and low ground bounce. A very fast falling edge can be obtained.

5 Claims, 2 Drawing Sheets

SAWTOOTH OSCILLATOR

CROSS-REFERENCE TO RELATED APPLICATIONS

This application claims the priority under 35 U.S.C. §119 of European patent application no. 10163631.4, filed on May 21, 2010, the contents of which are incorporated by reference herein.

This invention relates to sawtooth oscillators.

For high frequency applications, such as DC/DC converters, in the frequency range above 5 MHz, there is a need for a saw tooth signal with a short falling edge and a linear rising ramp. In addition, there is a need for low current consumption and low ground bounce especially after the falling edge.

Saw tooth oscillators normally have a falling edge created by discharging a capacitor, and the timing of the rising ramp and the falling edge determine the frequency. For high frequencies, there is a need for a discharge current that is much higher than the charge current, in order to achieve the desired rapid discharge. This discharge current will flow to ground. This can produce unwanted bouncing in integrated circuits, and the high discharge current can thus create disturbance to other circuits.

There is therefore a need for a saw tooth oscillator design which provides such a clean output that it is suitable for high frequency operation (such as in a frequency range above 5 MHz) and in which the discharge current is kept to a low level.

According to the invention there is provided a sawtooth generator circuit, comprising:

a first triangular waveform generator with equal ramp up and ramp down rates;

a second triangular waveform generator with equal ramp up and ramp down rates and which are equal to the ramp up and ramp down rates of the first triangular waveform generator, wherein the first and second triangular waveform generators are controlled to be 180 degrees out of phase; and a switching arrangement for alternately switching the increasing or decreasing ramps of the first and second triangular waveform generators to an output of the sawtooth generator circuit.

The invention provides a sawtooth generator circuit which is suitable for high frequency applications, with low current consumption and low ground bounce. A very fast falling edge (or a very fast rising edge for an inverted sawtooth) can be obtained. In particular, for a standard sawtooth output, the circuit enables a short falling edge in relation to the rising ramp and a short recovering time after the falling edge.

The description that follows is based on the formation of a standard sawtooth signal, with slow rising edges and fast falling edges, although the same concepts can be applied to the opposite signal with fast rising edges and slow falling edges.

The invention is based on the idea of forming the rising edges alternately from two coupled oscillators with triangular output waveforms. The rising ramps are switched to the output. A low discharge current in the range of twice the charge current is obtained so that there are no high discharge peak currents to ground.

A low current consumption, for example in the range of less than 50 uA can be achieved.

The switching arrangement preferably controls the first and second triangular waveform generators by switching them between ramp up and ramp down modes, as well as controlling the switching of one of the triangular waveform generator signals to the output. The same trigger is thus used to change the direction of the triangular waveform generators and to switch the output. In this way, synchronism is ensured.

First and second comparators can be provided at the outputs of the first and second triangular waveform generators, respectively, and a voltage source which provides a reference voltage to the first and second comparators. The reference voltage determines when the comparators are activated to switch the ramp direction. In this way, the reference voltage determines the duration of the ramp-up, and can therefore be used to control the frequency of the signal in a very simple manner.

A latch circuit can be controlled by the comparator outputs, for latching in response to the comparator outputs. For example, the latch can comprise an RS latch, which latches in response to pulses on the comparator outputs. This toggles between R (reset) and S (set) states.

A first latch output can control switching between the ramp up and ramp down modes of one of the triangular waveform generators and a second, complementary, latch output controls switching between the ramp up and ramp down modes of the other of the triangular waveform generators. This ensures the switching between ramp up and ramp down modes of the two triangular waveform generators is again synchronised.

One of the two latch outputs also controls the switching of the increasing ramps of the first and second triangular waveform generators to the output, using an output switch.

Each of the first and second triangular waveform generators can comprise:

a current source;

a current mirror having an output transistor for providing a charge current to an output capacitor; and a discharge transistor for draining the charge from the output capacitor, wherein the discharge transistor is switched off for a ramp up mode and switched on for a ramp down mode of the triangular waveform generator.

During charging, a fixed current is provided to the output capacitor. During discharge, double the current is drained, so that the charge current (which continues to flow) is drained, and additionally the capacitor is discharged at the same rate that it was charged. The current to ground remains essentially constant for the two waveform generators (a discharge current of 2 A in one and a charging current of A in the other).

The invention also provides a method of generating a sawtooth signal, comprising:

generating a first triangular waveform with equal ramp up and ramp down rates;

generating a second triangular waveform with equal ramp up and ramp down rates and which are equal to the ramp up and ramp down rates of the first triangular waveform;

controlling the first and second triangular waveforms to be 180 degrees out of phase and alternately switching the increasing or decreasing ramps of the first and second triangular waveforms to an output of the sawtooth generator circuit.

An example of the invention will now be described in detail with reference to the accompanying drawings, in which.

The invention provides a sawtooth generator circuit in which the increasing ramps of first and second triangular waveform generators are used alternately to form the rising edges of the sawtooth signal. The output of the generator circuit switches between these increasing ramps so that a fast step down at the end of each ramp is achieved.

Figure 1:
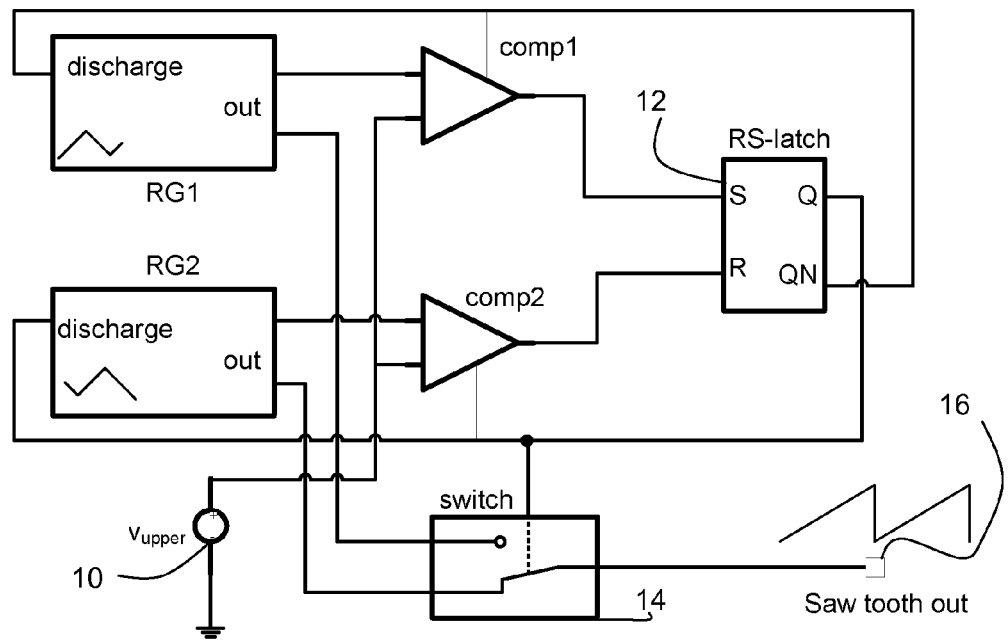
FIG. 1 shows in schematic form a circuit of the invention.

FIG. 1 shows in schematic form a circuit of the invention.

The circuit comprises a first triangular waveform generator RG1 (Ramp Generator) with equal ramp up and ramp down rates, and a second triangular waveform generator RG2 with equal ramp up and ramp down rates and which are equal to the ramp up and ramp down rates of the first triangular waveform generator. The first and second triangular waveform generators RG1 and RG2 are controlled to be 180 degrees out of phase.

The increasing ramps of the first and second triangular waveform signals are switched to an output of the sawtooth generator circuit.

By "triangular waveform" is meant a signal which ramps up and down in succession between two levels.

Figure 2:
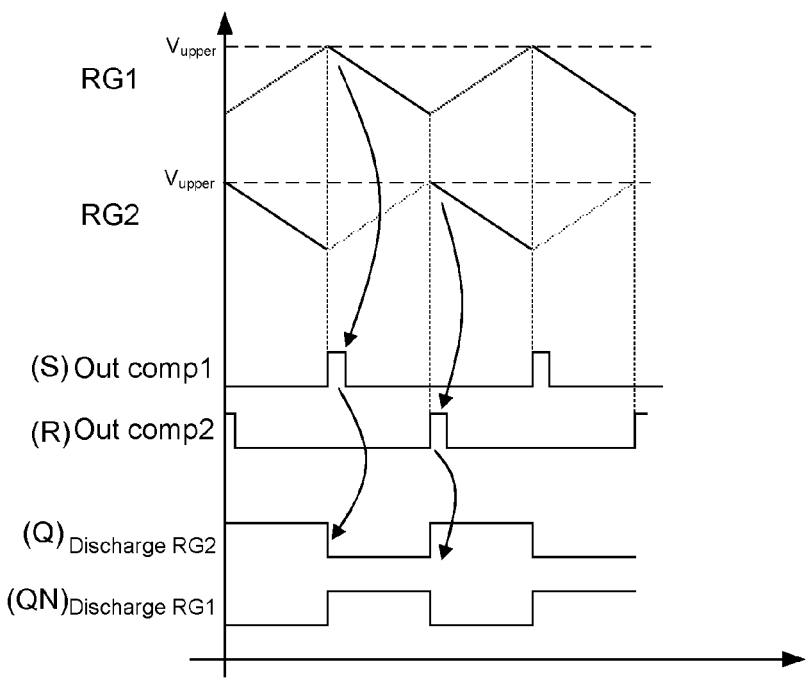
FIG. 2 is used to explain the timing in the circuit of FIG. 1.

FIG. 2 is used to explain the timing in the circuit of FIG. 1, and the further details of the circuit and the operation will be explained with reference to FIGS. 1 and 2.

The output voltage of the first triangular waveform generator RG1 ramps up to an upper limit $V_{upper}$ which is set by a reference voltage generator 10. The rise time depends on the load current and the internal capacitor of the generator RG1. Due to the 180 degree phase difference, the output voltage of the second generator RG2 is ramping down.

First and second comparators comp1 and comp2 are provided at the outputs of the first and second triangular waveform generators RG1, RG2, and these compare the ramp outputs with the threshold set by the reference voltage generator. The comparator output signals are provided to a set-reset (RS) latch 12, with one coupled to the Set input and the other coupled to the Reset input.

If the output voltage of RG1 exceeds the upper threshold $V_{upper}$, the comparator comp1 generates a rising edge (in this example; of course, a falling edge could equally be used as the trigger mechanism). This sets the RS-latch and causes the output QN to go high. This in turn triggers the output voltage of RG1 to ramp down, as it is coupled to a discharge control terminal of the waveform generator RG1. A high signal to the discharge control terminal activates the ramp down (discharge) mode, whereas a low signal to the discharge control terminal activates the ramp up (charge) mode.

At the same time that QN switches, the complementary Q output of the RS-latch switches as well and controls the discharge control terminal of the second waveform generator RG2. The output voltage of RG2 will start ramping up (as shown in FIG. 2).

When the output voltage of RG2 exceeds the same threshold $V_{upper}$, the RS-latch will be reset via the second comparator comp2 and the second waveform generator RG2 will be discharged and the first waveform generator RG1 will start the ramp up cycle.

The latch 12 sets a switch 14 that always connects the rising ramp of either RG1 or RG2 to the output 16 of the sawtooth generator circuit.

The latch is thus part of a switching arrangement, which controls the first and second triangular waveform generators by switching them between ramp up and ramp down modes, as well as controlling the switching of one of the triangular waveform generator signals to the output.

As can be seen, the two triangular waveform generators generate the rising edges of the saw tooth. The falling edges are generated by switching from the output of one triangular waveform to the other. The delay in this switching thus only depends on the speed of the switches as well of the connected capacitances.

The frequency of the saw tooth signal can be controlled using the threshold voltage $V_{upper}$. This provides a simple way to control the output signal characteristics.

The output load should have a low input capacitance, or else a comparator can be used to isolate the saw tooth signal from the capacitance of the load.

This circuit has a moderate current which is nearly constant to ground. Thus means that a high discharge current (much higher than the charge current) is avoided. In this way, high ground disturbances are avoided as well as large undershoots. In the circuit of the invention, the moderate current in both directions—rising as well as falling—keeps the circuit in operating range.

Figure 3:
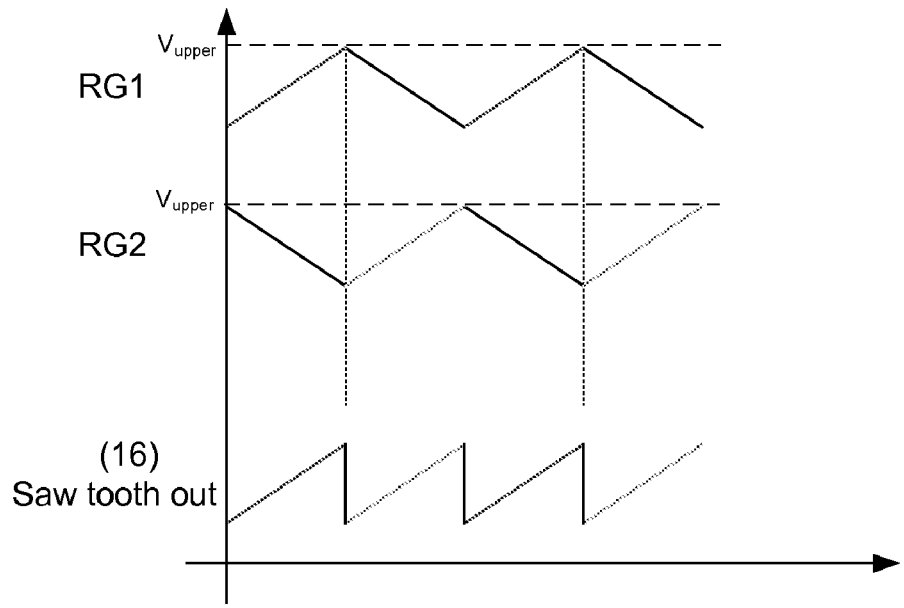
FIG. 3 is used to explain further the timing in the circuit of FIG. 1.

FIG. 3 shows the two output signals of the ramp generators RG1 and RG2 and shows the sawtooth output signal formed from the alternating rising ramps.

Figure 4:
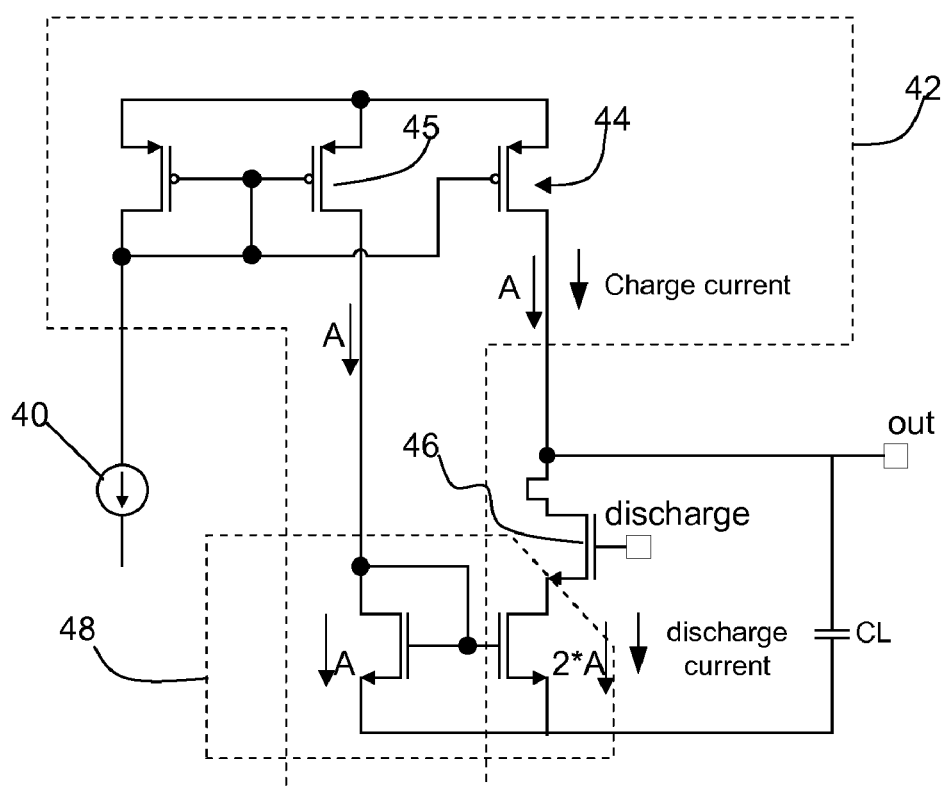
FIG. 4 shows one way to implement each of the ram generators in the circuit of FIG. 1.

FIG. 4 shows a simplified circuit suitable for each of the triangular ramp generators.

The circuit comprises a current source 40 and a current mirror 42 having a first output transistor 44 for providing a charge current to an output capacitor CL, and a second output transistor 45 providing the charge current to a second current mirror, described below.

A discharge transistor 46 is provided for draining the charge from the output capacitor CL. The output transistor and discharge transistor are in series, with the node between them defining the output. When the discharge transistor is switched off, the output transistor provides the charge current directly to the capacitor, which ramps up its voltage. The charge current can be equal to the current of the current source 40, or it may be a scaled version. This defines the ramp up mode—with the discharge transistor turned off.

When the discharge transistor is turned on, the capacitor CL is discharged. The second current mirror 48 sets the discharge current as twice the charging current. Thus, the charging current, which continues to flow because the current mirror 42 is still active, flows through the discharge transistor 46. In addition, a ramp down current equal to the previous ramp up current also flows from the capacitor through the discharge transistor 46.

Each triangular waveform generator thus operates by charging and discharging an output capacitor with a constant current. A current source and current mirror circuits are used to control the switching between charging and discharging. Although only one example of triangular waveform generator has been shown, other circuits can operate in the same way. For example, voltage controlled circuits can be used to generate the desired charging and discharging current. The invention is primarily based on the way the triangular waveforms are combined, and can be applied with any circuit that generates the desired two symmetrical out-of-phase triangular waveforms.

Similarly, the use of a single latch to control the two waveform generators is only the preferred example. The two waveform generators may be controlled by other circuits. The important concept is that the rising ramp surfaces are alternately selected and combined to derive the sawtooth output.

The circuit of the invention can be used at high frequencies, for example above 5 MHz, and even above 6 MHz. This makes it suitable for DC/DC switch mode signal generation, for example for mobile applications. However, the invention is of interest for all frequencies, because it generates an extremely clean sawtooth waveform.

The discharge current will be approximately two times the charge current, compared with very high discharge current of more then 20 times the charge current in existing circuit designs. In practice, the discharge current will be slightly higher than two times so that the low or starting level can be reached in all circumstances.

Due to the use of two ramp generators, the combined current to ground is nearly constant. If RG1 will be charged, RG2 will be discharged and vice versa. A further advantage is the undershoot avoidance of the falling edge. If using high discharge currents there is long period to come back to the operating point. With the smooth ramp of a triangular wave it is possible to remain in operation range.

As mentioned above, the example above is based on a sawtooth signal with slowly rising edges and steeply falling edges. The same concepts can be applied to form the opposite signal—with rapid rising edges and slowly falling edges. In this case, the decreasing ramps are alternately used to form the (opposite) sawtooth signal. Also, the outputs signal can be inverted, so that the falling edges of the triangular waveforms can be used, followed by inversion to generate the standard sawtooth waveform. This inverter could also serve to isolate the load capacitance at the output from the circuit. The term "output terminal" can include the terminal before such an inverter, and may therefore be an internal node rather than an external node of the circuit.

The sawtooth signal shows oscillates between ground and a maximum. However, the a dc voltage shift can be applied, either by using triangular waveform generators with an offset or by adding an offset to the generated sawtooth signal.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality.

The mere fact that certain measures are recited in mutually different dependent claims does not indicate that a combination of these measured cannot be used to advantage. Any reference signs in the claims should not be construed as limiting the scope.

The invention claimed is:

1. A sawtooth generator circuit, comprising:
a first triangular waveform (RG1) generator with equal ramp up and ramp down rates;
a second triangular waveform generator (RG2) with equal ramp up and ramp down rates and which are equal to the ramp up and ramp down rates of the first triangular waveform generator, wherein the first and second triangular waveform generators (RG1,RG2) are controlled to be 180 degrees out of phase; and
a switching arrangement (14) for alternately switching the increasing or decreasing ramps of the first and second triangular waveform generators to an output (16) of the sawtooth generator circuit,
wherein the switching arrangement controls the first and second triangular waveform generators by switching them between ramp up and ramp down modes, as well as switching one of the triangular waveform generator signals to the output,
characterized in that the sawtooth generator circuit comprises:
first and second comparators at the outputs of the first and second triangular waveform generators, respectively, and a voltage source which provides a reference voltage to the first and second comparators;
a latch circuit controlled by the comparator outputs, for latching in response to the comparator outputs,
wherein a first latch output controls switching between the ramp up and ramp down modes of one of the triangular waveform generators and a second, complementary, latch output controls switching between the ramp up and ramp down modes of the other of the triangular waveform generators, and one of the latch outputs controls the switching of the increasing or decreasing ramps of the first and second triangular waveform generators to the output.

2. The sawtooth generator circuit as claimed in claim 1, wherein the latch circuit comprises an RS latch, which latches in response to pulses on the comparator outputs.

3. A circuit as claimed in claim 1, wherein each of the first and second triangular waveform generators comprises:
a current source;
a current mirror having an output transistor for providing a charge current to an output capacitor; and
a discharge transistor for draining the charge from the output capacitor, wherein the discharge transistor is switched off for a ramp up mode and switched on for a ramp down mode of the triangular waveform generator.

4. A method of generating a sawtooth signal, comprising:
generating a first triangular waveform with equal ramp up and ramp down rates;
generating a second triangular waveform with equal ramp up and ramp down rates to those of the first triangular waveform;
controlling the first and second triangular waveforms to be 180 degrees out of phase and alternately switching the increasing or decreasing ramps of the first and second triangular waveforms to an output; and
switching first and second triangular waveform generators which generate the first and second triangular waveforms respectively, between ramp up and ramp down modes in synchronism with switching one of the triangular waveforms to the output
characterized in that the method further comprises:
using a latch circuit to generate a first latch output which controls switching between the ramp up and ramp down modes of one of the triangular waveform generators and a second, complementary, latch output which controls switching between the ramp up and ramp down modes of the other of the triangular waveform generators, and using one of the outputs of the latch circuit to control the switching of the increasing or decreasing ramps of the first and second triangular waveforms to the output,
and in that the method also comprises comparing the first and second triangular waveforms with a reference voltage ($V_{upper}$) generate latch control signals.

5. A method as claimed in claim 4, comprising setting a frequency of the sawtooth signal by selecting the reference voltage ($V_{upper}$).

* * * * *